(12) United States Patent
Fox et al.

(10) Patent No.: US 12,206,531 B2
(45) Date of Patent: Jan. 21, 2025

(54) METHODS AND SYSTEMS FOR HIGH BANDWIDTH COMMUNICATIONS INTERFACE

(71) Applicant: Kandou Labs, S.A., Lausanne (CH)

(72) Inventors: John Fox, Kislingbury (GB); Brian Holden, Monte Sereno, CA (US); Ali Hormati, Ecublens Vaud (CH); Peter Hunt, Northampton (GB); John D. Keay, Bedford (GB); Amin Shokrollahi, Préverenges (CH); Richard Simpson, Bedford (GB); Anant Singh, Pully (CH); Andrew Kevin John Stewart, Astcote (GB); Giuseppe Surace, Northampton (GB); Roger Ulrich, Bern (CH)

(73) Assignee: Kandou Labs, S.A., Lausanne (CH)

( * ) Notice: Subject to any disclaimer, the term of this patent is extended or adjusted under 35 U.S.C. 154(b) by 277 days.

(21) Appl. No.: 17/851,740

(22) Filed: Jun. 28, 2022

(65) Prior Publication Data

US 2022/0329467 A1     Oct. 13, 2022

Related U.S. Application Data

(63) Continuation of application No. 16/143,228, filed on Sep. 26, 2018, now Pat. No. 11,374,801, which is a
(Continued)

(51) Int. Cl.
*H04L 25/08* (2006.01)
*G01R 31/3183* (2006.01)
(Continued)

(52) U.S. Cl.
CPC ........ *H04L 25/085* (2013.01); *G01R 31/3183* (2013.01); *H01L 29/76833* (2013.01);
(Continued)

(58) Field of Classification Search
CPC ..... H04L 25/085; H04L 5/02; H04L 25/0272; H04L 25/0282; H04L 25/03057;
(Continued)

(56) References Cited

U.S. PATENT DOCUMENTS 789,497 A     5/1905   Johnson
3,196,351 A   7/1965   David
(Continued)

FOREIGN PATENT DOCUMENTS

CN        1864346 A      11/2006
CN      101854223 A      10/2010
(Continued)

OTHER PUBLICATIONS

Machine Translation of KR0340178B1, 1-8 (8 pages).
(Continued)

*Primary Examiner* — Freshteh N Aghdam

(57) ABSTRACT

A pair of ground planes arranged in parallel, a dielectric medium disposed in between the pair of ground planes, and a set of at least four signal conductors disposed in the dielectric medium, the set of at least four signal conductors having (i) a first pair of signal conductors arranged proximate to a first ground plane of the pair of ground planes and (ii) a second pair of signal conductors arranged proximate to a second ground plane of the pair of ground planes, each signal conductor of the set of at least four signal conductors configured to carry a respective signal corresponding to a symbol of a codeword of a vector signaling code.

48 Claims, 9 Drawing Sheets

Related U.S. Application Data continuation of application No. 15/457,935, filed on Mar. 13, 2017, now Pat. No. 10,091,035, which is a continuation of application No. 14/253,584, filed on Apr. 15, 2014, now Pat. No. 9,596,109.

(60) Provisional application No. 61/812,667, filed on Apr. 16, 2013.

(51) Int. Cl.
| | |
|---|---|
| *H01L 29/768* | (2006.01) |
| *H01Q 13/24* | (2006.01) |
| *H01Q 13/28* | (2006.01) |
| *H01R 12/00* | (2006.01) |
| *H04L 5/02* | (2006.01) |
| *H04L 25/02* | (2006.01) |
| *H04L 25/03* | (2006.01) |
| *H04L 25/14* | (2006.01) |
| *H04L 25/49* | (2006.01) |
| *H04L 27/01* | (2006.01) |
| *H03M 5/04* | (2006.01) |
| *H03M 5/16* | (2006.01) |
| *H03M 13/31* | (2006.01) |
| *H04L 1/00* | (2006.01) |

(52) U.S. Cl.
CPC ....... *H01L 29/76866* (2013.01); *H01Q 13/24* (2013.01); *H01Q 13/28* (2013.01); *H01R 12/00* (2013.01); *H04L 5/02* (2013.01); *H04L 25/0272* (2013.01); *H04L 25/0282* (2013.01); *H04L 25/03057* (2013.01); *H04L 25/03146* (2013.01); *H04L 25/03343* (2013.01); *H04L 25/03885* (2013.01); *H04L 25/14* (2013.01); *H04L 25/4919* (2013.01); *H04L 27/01* (2013.01); *H03M 5/04* (2013.01); *H03M 5/16* (2013.01); *H03M 13/31* (2013.01); *H04L 1/0041* (2013.01); *H04L 1/0057* (2013.01); *H04L 2001/0094* (2013.01); *H04L 2025/03426* (2013.01)

(58) Field of Classification Search
CPC ......... H04L 25/03146; H04L 25/03343; H04L 25/03885; H04L 25/14; H04L 25/4919; H04L 27/01; H04L 1/0041; H04L 1/0057; H04L 2001/0094; H04L 2025/03426; G01R 31/3183; H01L 29/76833; H01L 29/76866; H01Q 13/24; H01Q 13/28; H01R 12/00; H03M 5/04; H03M 5/16; H03M 13/31

See application file for complete search history.

(56) References Cited

U.S. PATENT DOCUMENTS

| | | | |
|---|---|---|---|
| 3,970,795 A | 7/1976 | Allen | |
| 3,992,616 A | 11/1976 | Acker | |
| 4,163,258 A | 7/1979 | Ebihara et al. | |
| 4,499,550 A | 2/1985 | Ray et al. | |
| 5,053,974 A | 10/1991 | Penz | |
| 5,166,956 A | 11/1992 | Baltus et al. | |
| 5,311,516 A | 5/1994 | Kuznicki et al. | |
| 5,331,320 A | 7/1994 | Cideciyan et al. | |
| 5,412,689 A | 5/1995 | Chan et al. | |
| 5,449,895 A | 9/1995 | Hecht et al. | |
| 5,553,097 A | 9/1996 | Dagher | |
| 5,808,529 A * | 9/1998 | Hamre | H05K 1/0219 333/260 |
| 5,847,324 A * | 12/1998 | Farquhar | H01B 7/0861 174/117 FF |
| 5,856,935 A | 1/1999 | Moy et al. | |
| 5,982,954 A | 11/1999 | Delen et al. | |
| 6,005,895 A | 12/1999 | Perino et al. | |
| 6,011,524 A * | 1/2000 | Jervis | H01Q 11/08 343/859 |
| 6,084,883 A | 7/2000 | Norrell et al. | |
| 6,084,958 A | 7/2000 | Blossom | |
| 6,097,732 A | 8/2000 | Jung | |
| 6,111,895 A | 8/2000 | Miller et al. | |
| 6,154,498 A | 11/2000 | Dabral et al. | |
| 6,226,330 B1 * | 5/2001 | Mansur | H04B 3/00 375/257 |
| 6,278,740 B1 | 8/2001 | Nordyke | |
| 6,317,465 B1 | 11/2001 | Akamatsu et al. | |
| 6,359,931 B1 | 3/2002 | Perino et al. | |
| 6,452,420 B1 | 9/2002 | Wong | |
| 6,483,828 B1 | 11/2002 | Balachandran et al. | |
| 6,504,875 B2 | 1/2003 | Perino et al. | |
| 6,556,628 B1 | 4/2003 | Poulton et al. | |
| 6,621,427 B2 | 9/2003 | Greenstreet | |
| 6,621,945 B2 | 9/2003 | Bissessur | |
| 6,650,638 B1 | 11/2003 | Walker et al. | |
| 6,661,355 B2 | 12/2003 | Cornelius et al. | |
| 6,690,739 B1 | 2/2004 | Mui | |
| 6,766,342 B2 | 7/2004 | Kechriotis | |
| 6,865,236 B1 | 3/2005 | Terry | |
| 6,876,317 B2 | 4/2005 | Sankaran | |
| 6,898,724 B2 | 5/2005 | Chang | |
| 6,954,492 B1 | 10/2005 | Williams | |
| 6,990,138 B2 | 1/2006 | Bejjani et al. | |
| 6,999,516 B1 | 2/2006 | Rajan | |
| 7,023,817 B2 | 4/2006 | Kuffner et al. | |
| 7,039,136 B2 | 5/2006 | Olson et al. | |
| 7,075,996 B2 | 7/2006 | Simon et al. | |
| 7,127,003 B2 | 10/2006 | Rajan et al. | |
| 7,142,612 B2 | 11/2006 | Horowitz et al. | |
| 7,167,523 B2 | 1/2007 | Mansur | |
| 7,180,949 B2 | 2/2007 | Kleveland et al. | |
| 7,184,483 B2 | 2/2007 | Rajan | |
| 7,269,212 B1 | 9/2007 | Chau et al. | |
| 7,339,990 B2 | 3/2008 | Hidaka | |
| 7,356,213 B1 | 4/2008 | Cunningham et al. | |
| 7,358,869 B1 | 4/2008 | Chiarulli et al. | |
| 7,496,130 B2 | 2/2009 | Rumney | |
| 7,633,850 B2 | 12/2009 | Ahn | |
| 7,656,321 B2 | 2/2010 | Wang | |
| 7,706,456 B2 | 4/2010 | Laroia et al. | |
| 7,746,764 B2 | 6/2010 | Rawlins et al. | |
| 7,822,113 B2 | 10/2010 | Tonietto et al. | |
| 7,868,790 B2 | 1/2011 | Bae | |
| 7,869,497 B2 | 1/2011 | Benvenuto et al. | |
| 7,869,546 B2 | 1/2011 | Tsai | |
| 7,873,115 B2 | 1/2011 | Zerbe et al. | |
| 7,899,653 B2 | 3/2011 | Hollis | |
| 8,050,332 B2 | 11/2011 | Chung et al. | |
| 8,055,095 B2 | 11/2011 | Palotai et al. | |
| 8,149,906 B2 | 4/2012 | Saito et al. | |
| 8,159,375 B2 | 4/2012 | Abbasfar | |
| 8,159,376 B2 | 4/2012 | Abbasfar | |
| 8,199,849 B2 | 6/2012 | Oh et al. | |
| 8,199,863 B2 | 6/2012 | Chen et al. | |
| 8,218,670 B2 | 7/2012 | Abou | |
| 8,245,094 B2 | 8/2012 | Jiang et al. | |
| 8,279,745 B2 | 10/2012 | Dent | |
| 8,279,976 B2 | 10/2012 | Lin et al. | |
| 8,284,848 B2 | 10/2012 | Nam et al. | |
| 8,289,914 B2 | 10/2012 | Li et al. | |
| 8,295,250 B2 | 10/2012 | Gorokhov et al. | |
| 8,365,035 B2 | 1/2013 | Hara | |
| 8,472,513 B2 | 6/2013 | Malipatil et al. | |
| 8,498,368 B1 | 7/2013 | Husted et al. | |
| 8,520,493 B2 | 8/2013 | Goulahsen | |
| 8,539,318 B2 | 9/2013 | Shokrollahi et al. | |
| 8,577,284 B2 | 11/2013 | Seo et al. | |
| 8,588,254 B2 | 11/2013 | Diab et al. | |
| 8,588,280 B2 | 11/2013 | Oh et al. | |
| 8,593,305 B1 | 11/2013 | Tajalli et al. | |
| 8,620,166 B2 | 12/2013 | Guha | |
| 8,644,497 B2 | 2/2014 | Clausen et al. | |

(56) References Cited

U.S. PATENT DOCUMENTS

| | | |
|---|---|---|
| 8,649,445 B2 | 2/2014 | Cronie et al. |
| 8,687,968 B2 | 4/2014 | Nosaka et al. |
| 8,718,184 B1 | 5/2014 | Cronie et al. |
| 8,731,039 B1 | 5/2014 | Sarrigeorgidis et al. |
| 8,755,426 B1 | 6/2014 | Cronie et al. |
| 8,773,964 B2 | 7/2014 | Hsueh et al. |
| 8,780,687 B2 | 7/2014 | Clausen et al. |
| 8,791,735 B1 | 7/2014 | Shibasaki |
| 8,831,440 B2 | 9/2014 | Yu et al. |
| 8,861,583 B2 | 10/2014 | Liu |
| 8,879,660 B1 | 11/2014 | Peng et al. |
| 8,934,594 B1 | 1/2015 | Malhotra |
| 8,938,171 B2 | 1/2015 | Tang et al. |
| 8,949,693 B2 | 2/2015 | Ordentlich et al. |
| 8,989,317 B1 | 3/2015 | Holden et al. |
| 8,996,740 B2 | 3/2015 | Wiley et al. |
| 9,015,566 B2 | 4/2015 | Cronie et al. |
| 9,071,476 B2 | 6/2015 | Fox et al. |
| 9,077,386 B1 | 7/2015 | Holden et al. |
| 9,083,576 B1 | 7/2015 | Hormati |
| 9,100,232 B1 | 8/2015 | Hormati et al. |
| 9,106,462 B1 | 8/2015 | Aziz et al. |
| 9,124,557 B2 | 9/2015 | Fox et al. |
| 9,197,470 B2 | 11/2015 | Okunev |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,397,868 B1 | 7/2016 | Hossain et al. |
| 9,401,828 B2 | 7/2016 | Cronie et al. |
| 9,432,082 B2 | 8/2016 | Ulrich et al. |
| 9,438,409 B1 | 9/2016 | Liao et al. |
| 9,461,862 B2 | 10/2016 | Holden et al. |
| 9,479,369 B1 | 10/2016 | Shokrollahi |
| 9,509,437 B2 | 11/2016 | Shokrollahi |
| 9,520,883 B2 | 12/2016 | Shibasaki |
| 9,537,644 B2 | 1/2017 | Jones et al. |
| 9,571,309 B1 | 2/2017 | Sakai |
| 9,634,797 B2 | 4/2017 | Benammar et al. |
| 9,667,379 B2 | 5/2017 | Cronie et al. |
| 9,705,708 B1 | 7/2017 | Jin et al. |
| 9,710,412 B2 | 7/2017 | Sengoku |
| 10,055,372 B2 | 8/2018 | Shokrollahi |
| 10,326,623 B1 | 6/2019 | Tajalli |
| 2001/0006538 A1 | 7/2001 | Simon et al. |
| 2001/0055294 A1 | 12/2001 | Motoyoshi |
| 2002/0044316 A1 | 4/2002 | Myers |
| 2002/0152340 A1 | 10/2002 | Dreps et al. |
| 2002/0174373 A1 | 11/2002 | Chang |
| 2002/0181607 A1 | 12/2002 | Izumi |
| 2003/0086366 A1 | 5/2003 | Branlund et al. |
| 2003/0087634 A1 | 5/2003 | Raghavan et al. |
| 2003/0185310 A1 | 10/2003 | Ketchum et al. |
| 2004/0057525 A1 | 3/2004 | Rajan et al. |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0213686 A1 | 9/2005 | Love et al. |
| 2006/0013331 A1 | 1/2006 | Choi et al. |
| 2006/0056538 A1 | 3/2006 | Nam et al. |
| 2006/0126751 A1 | 6/2006 | Bessios |
| 2006/0159005 A1 | 7/2006 | Rawlins et al. |
| 2006/0233291 A1 | 10/2006 | Garlepp et al. |
| 2006/0251421 A1 | 11/2006 | Arnon |
| 2006/0291589 A1 | 12/2006 | Eliezer et al. |
| 2007/0030796 A1 | 2/2007 | Green |
| 2007/0070967 A1 | 3/2007 | Yang et al. |
| 2008/0043677 A1 | 2/2008 | Kim et al. |
| 2008/0069198 A1 | 3/2008 | Bhoja et al. |
| 2008/0104374 A1 | 5/2008 | Mohamed |
| 2008/0192621 A1 | 8/2008 | Suehiro |
| 2008/0316070 A1 | 12/2008 | Van et al. |
| 2009/0046009 A1 | 2/2009 | Fujii |
| 2009/0059782 A1 | 3/2009 | Cole |
| 2009/0110106 A1 | 4/2009 | Wornell et al. |
| 2009/0154604 A1 | 6/2009 | Lee et al. |
| 2009/0302976 A1* | 12/2009 | Cho .............. H05K 1/0225 333/238 |
| 2009/0315649 A1* | 12/2009 | Minegishi .......... H01P 3/026 333/238 |
| 2010/0020862 A1 | 1/2010 | Peng |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0215112 A1 | 8/2010 | Tsai et al. |
| 2010/0235673 A1 | 9/2010 | Abbasfar |
| 2010/0296556 A1 | 11/2010 | Rave et al. |
| 2010/0309964 A1 | 12/2010 | Oh et al. |
| 2011/0014865 A1 | 1/2011 | Seo et al. |
| 2011/0018749 A1 | 1/2011 | Muto et al. |
| 2011/0122767 A1 | 5/2011 | Dent |
| 2011/0134678 A1 | 6/2011 | Sato et al. |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0286511 A1 | 11/2011 | Zeng et al. |
| 2011/0299555 A1* | 12/2011 | Cronie ............. H04L 1/0041 370/476 |
| 2011/0302478 A1 | 12/2011 | Cronie et al. |
| 2012/0082203 A1 | 4/2012 | Zerbe et al. |
| 2012/0213267 A1 | 8/2012 | Stojanovic et al. |
| 2012/0213299 A1 | 8/2012 | Cronie et al. |
| 2012/0257683 A1 | 10/2012 | Schwager et al. |
| 2012/0327993 A1 | 12/2012 | Palmer |
| 2013/0010892 A1 | 1/2013 | Cronie et al. |
| 2013/0013870 A1 | 1/2013 | Cronie et al. |
| 2013/0114392 A1 | 5/2013 | Sun et al. |
| 2013/0202001 A1 | 8/2013 | Zhang |
| 2013/0259113 A1 | 10/2013 | Kumar |
| 2013/0322512 A1 | 12/2013 | Francese et al. |
| 2014/0006649 A1 | 1/2014 | Wiley et al. |
| 2014/0169426 A1 | 6/2014 | Aziz et al. |
| 2014/0177645 A1 | 6/2014 | Cronie et al. |
| 2014/0177699 A1 | 6/2014 | Tan et al. |
| 2014/0226734 A1 | 8/2014 | Fox et al. |
| 2014/0254642 A1 | 9/2014 | Fox et al. |
| 2014/0286381 A1 | 9/2014 | Shibasaki |
| 2015/0078479 A1 | 3/2015 | Whitby-Strevens |
| 2015/0117579 A1 | 4/2015 | Shibasaki |
| 2015/0180642 A1 | 6/2015 | Hsieh et al. |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0319015 A1 | 11/2015 | Malhotra |
| 2015/0333940 A1 | 11/2015 | Shokrollahi |
| 2015/0349835 A1 | 12/2015 | Fox et al. |
| 2015/0365263 A1 | 12/2015 | Zhang et al. |
| 2015/0380087 A1 | 12/2015 | Mittelholzer et al. |
| 2015/0381768 A1 | 12/2015 | Fox et al. |
| 2016/0020824 A1 | 1/2016 | Ulrich et al. |
| 2016/0036616 A1 | 2/2016 | Holden et al. |
| 2016/0056980 A1 | 2/2016 | Wang et al. |
| 2016/0087610 A1 | 3/2016 | Hata |
| 2016/0218894 A1 | 7/2016 | Fox et al. |
| 2016/0338040 A1 | 11/2016 | Lee et al. |
| 2016/0380787 A1 | 12/2016 | Hormati et al. |
| 2017/0019276 A1 | 1/2017 | Francese |
| 2017/0272285 A1 | 9/2017 | Shokrollahi et al. |
| 2017/0373889 A1 | 12/2017 | Sakai |
| 2018/0351769 A1 | 12/2018 | Tajalli et al. |
| 2019/0103903 A1 | 4/2019 | Yang |
| 2019/0109735 A1 | 4/2019 | Norimatsu |
| 2019/0199557 A1 | 6/2019 | Taylor et al. |
| 2020/0321778 A1 | 10/2020 | Gharibdoust et al. |
| 2021/0297292 A1 | 9/2021 | Hormati |

FOREIGN PATENT DOCUMENTS

| | | |
|---|---|---|
| CN | 114142964 A | 3/2022 |
| JP | 2003163612 A | 6/2003 |

(56) References Cited

FOREIGN PATENT DOCUMENTS

| JP | 4394755 B2 | 10/2009 | | |
|---|---|---|---|---|
| KR | 0340178 B1 | 6/2002 | | |
| WO | 2005032000 A1 | 4/2005 | | |
| WO | 2009084121 A1 | 7/2009 | | |
| WO | 2010031824 A1 | 3/2010 | | |
| WO | WO-2011096890 A1 | * | 8/2011 | ............... H01J 23/24 |
| WO | 2019241081 A1 | 12/2019 | | |

OTHER PUBLICATIONS

Abbasfar, Aliazam , "Generalized Differential Vector Signaling", IEEE International Conference on Communications, ICC '09, Jun. 14, 2009, 1-5 (5 pages).

Anonymous , "Constant-weight code", Wikipedia.org, retrieved on Feb. 6, 2017, (3 pages).

Counts, Lew , et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor , et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Farzan, Kamran , et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam , et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Hidaka, Yasuo , et al., "A 4-Channel 1.25-10.3 GB/s Backplane Transceiver Macro With 35 dB Equalizer and Sign-Based Zero-Forcing Adaptive Control", IEEE Journal of Solid-State Circuits, vol. 44, No. 12, Dec. 2009, 3547-3559 (13 pages).

Holden, Brian , "An exploration of the technical feasibility of the major technology options for 400GE backplanes", IEEE 802.3 400GE Study Group, Geneva, CH, Jul. 16, 2013, 1-18 (18 pages).

Holden, Brian , "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian , "Using Ensemble NRZ Coding for 400GE Electrical Interfaces", IEEE 802.3 400GE Study Group, May 17, 2013, 1-24 (24 pages).

Jiang, Anxiao , et al., "Rank Modulation for Flash Memories", IEEE Transactions of Information Theory, vol. 55, No. 6, Jun. 2009, 2659-2673 (16 pages).

Navid, Reza , et al., "A 40 GB/s Serial Link Transceiver in 28 nm CMOS Technology", IEEE Journal of Solid-State Circuits, vol. 50, No. 4, Apr. 2015, 814-827 (14 pages).

Oh, Dan , et al., "Pseudo-Differential Vector Signaling for Noise Reduction in Single-Ended Signaling Systems", DesignCon 2009, Rambus Inc., Jan. 2009, (22 pages).

Penttinen, Jyrki , et al., "Performance Model for Orthogonal Sub Channel in Noise-limited Environment", Sixth International Conference on Wireless and Mobile Communications, 2010, 56-61 (6 pages).

Poulton, John , "Multiwire Differential Signaling", UNC-CH Department of Computer Science Version 1.1, Aug. 6, 2003, 1-20 (20 pages).

She, James , et al., "A Framework of Cross-Layer Superposition Coded Multicast for Robust IPTV Services over WiMAX", IEEE Wireless Communications and Networking Conference, Apr. 15, 2008, 3139-3144 (6 pages).

Shibasaki, Takayuki , et al., "A 56-GB/s Receiver Front-End with a CTLE and 1-Tap DFE in 20-nm CMOS", IEEE 2014 Symposium on VLSI Circuits Digest of Technical Papers, 2014, (2 pages).

Skliar, Osvaldo , et al., "A Method For the Analysis of Signals: the Square-Wave Method", Revista de Matematica Teoria y Aplicationes, vol. 15, No. 2, Mar. 2008, 109-129 (21 pages).

Slepian, David , "Permutation Modulation", Proceedings of the IEE, vol. 53, No. 3, Mar. 1965, 228-236 (9 pages).

Wada, Tadahiro , et al., "A Study on Orthogonal Multi-Code CDMA Systems Using Constant Amplitude Coding", Technical Report of IEICE, vol. 97, No. 132, Jun. 24, 1997, 19-24 (6 pages).

Wang, Xin , et al., "Applying CDMA Technique to Network-on-Chip", IEEE Transactions on Very Large Scale Integration (VLSI) Systems, vol. 15, No. 10, Oct. 1, 2007, 1091-1100 (10 pages).

Won, Hyosup , et al., "A 28-GB/s Receiver With Self-contained Adaptive Equalization and Sampling Point Control Using Stochastic Sigma-Tracking Eye-Opening Monitor", IEEE Transactions on Circuits and Systems-I: Regular Papers, vol. 64, No. 3, Mar. 2017, 664-674 (11 pages).

* cited by examiner

| Transmit value | Wire 1 | Wire 2 | Wire 3 | Wire 4 | (Wire1+Wire2) > (Wire3+Wire4) | (Wire1+Wire3) > (Wire2+Wire4) | (Wire1+Wire4) > (Wire2+Wire3) | Receive Word |
|---|---|---|---|---|---|---|---|---|
| 7 | 1 | -1/3 | -1/3 | -1/3 | + | + | + | 111 |
| 4 | -1/3 | 1 | -1/3 | -1/3 | + | - | - | 100 |
| 2 | -1/3 | -1/3 | 1 | -1/3 | - | + | - | 010 |
| 1 | -1/3 | -1/3 | -1/3 | 1 | - | - | + | 001 |
| 0 | -1 | 1/3 | 1/3 | 1/3 | - | - | - | 000 |
| 3 | 1/3 | -1 | 1/3 | 1/3 | - | + | + | 011 |
| 5 | 1/3 | 1/3 | -1 | 1/3 | + | - | + | 101 |
| 6 | 1/3 | 1/3 | 1/3 | -1 | + | + | - | 110 |

FIG. 6

METHODS AND SYSTEMS FOR HIGH BANDWIDTH COMMUNICATIONS INTERFACE

CROSS-REFERENCE TO RELATED APPLICATIONS

This application is a continuation of U.S. application Ser. No. 16/143,228, filed Sep. 26, 2018, entitled "Methods and Systems for High Bandwidth Communications Interface", which is a continuation of U.S. application Ser. No. 15/457,935, filed Mar. 13, 2017, now U.S. Pat. No. 10,091,035, granted Oct. 2, 2018, entitled "Methods and Systems for High Bandwidth Communications Interface", which is a continuation of U.S. application Ser. No. 14/253,584, file Apr. 15, 2014, now U.S. Pat. No. 9,596,109, granted Mar. 14, 2017, entitled "Methods and Systems for High Bandwidth Communications Interface", which claims the benefit of U.S. provisional application No. 61/812,667 filed on Apr. 16, 2013, all of which are incorporated herein by reference in their entirety for all purposes.

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Provisional Patent Application No. 61/753,870, filed Jan. 17, 2013, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I"); and U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II").

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III").

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives the signal or signals (or at least something close, as noise and other effects might keep the received signal from being identical to the sent signal). The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is 2^8, or 256.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, Fox I, Fox II, and Fox III.

BRIEF SUMMARY

A transmitter and receiver can communicate using a serial communications link, wherein the serial communications link uses signaling that is vector signaling, balanced and can be detected using a plurality of comparators having inputs coupled to differing combinations of sums of components of a vector signal.

The number of components can be four, or more or less than four. The number of coordinate values for a component can be four, or more or less than four. For example, a link might use four components with four possible coordinate values, a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value.

In a receiver, some number of comparators compares sums of signals. In a specific embodiment, there are three comparators, each which compares sums of two of the received signals and collectively the output of the three comparators identify the three bits encoded by the signals. Signal equalization as commonly provided using Decision Feedback Equalization techniques may be advantageously applied at this receive comparison stage, or may more conventionally be applied to the received wire signals.

In accordance with at least one embodiment of the invention, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a ternary vector signaling code wherein each wire signal has one of three values, or a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

FIG. 6 is a chart shown example transmit wire values for each transmit data value, and corresponding example receive comparator outputs and receive data words, in accordance with at least one embodiment of the invention.

DETAILED DESCRIPTION

Despite the increasing technological ability to integrate entire systems into a single integrated circuit, multiple chip systems and subsystems retain significant advantages. The physical infrastructure to support high-bandwidth chip-to-chip connectivity is available, if the power, complexity, and other circuit implementation issues for such interfaces could be resolved.

For purposes of description and without limitation, example embodiments of at least some aspects of the invention herein described assume a systems environment of (1) at least one point-to-point communications interface connecting two integrated circuit chips representing a transmitter and a receiver, (2) wherein the communications interface is supported by an interconnection group of four high-speed transmission line signal wires providing medium loss connectivity at, as an example, 18.75 GHz (37.3 GigaSymbols/second) without excessive ripple loss characteristics or reflections, (3) the interconnection group of signal wires displaying low intra-ensemble skew, and (4) the communications interface operating at the example signaling rate of 37.3 GigaSymbols/second, delivering an aggregate throughput of approximately 112 gigabits/sec over the four wire circuit.

As subsequently described, at least one embodiment of the invention uses low signal swing current mode logic pin drivers and interconnection wiring terminated at both transmitter and receiver.

Physical Channel Wiring

Figure 2:
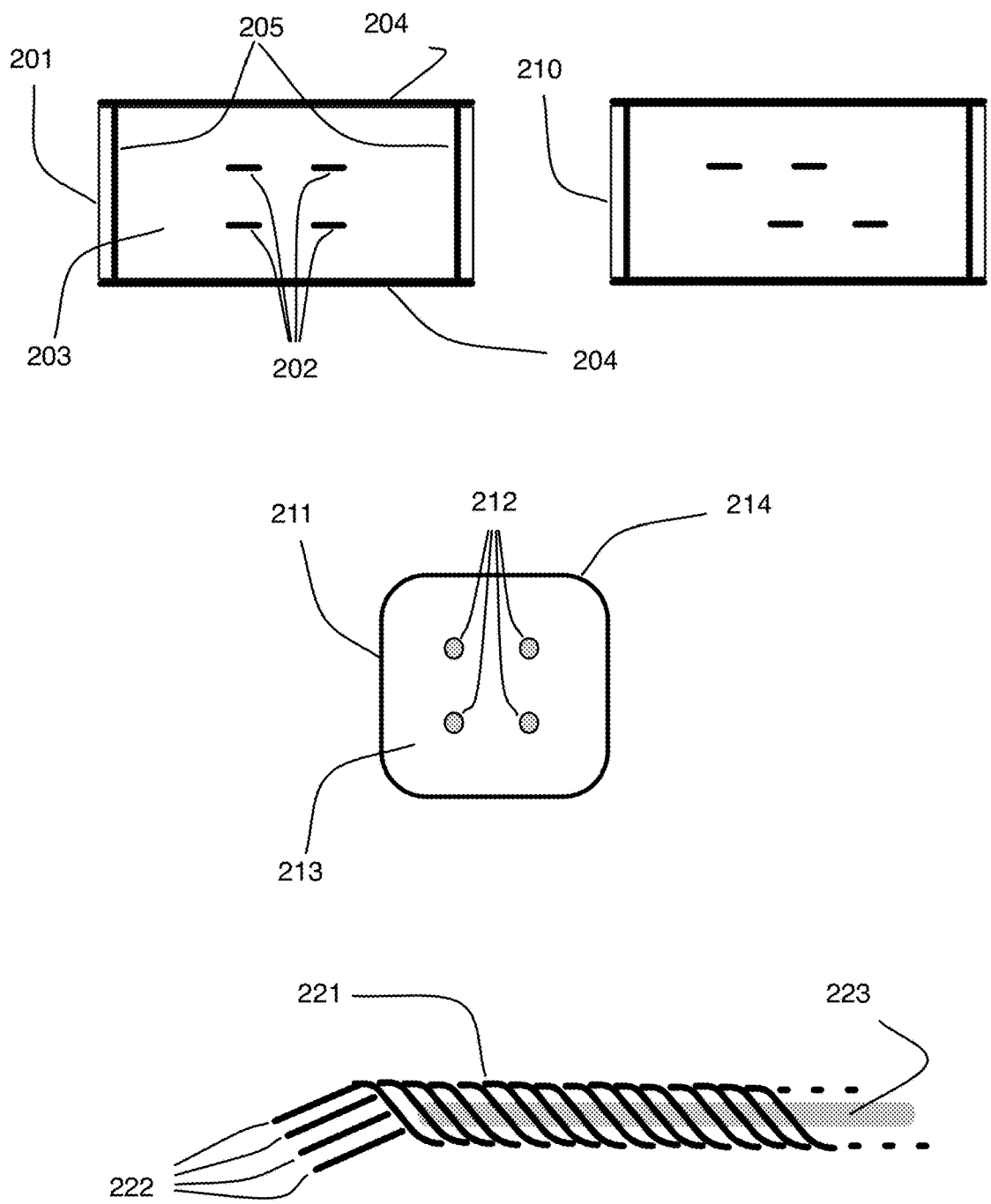
FIG. 2 shows several physical channel topologies suited for use with the described signal coding in at least one embodiment in accordance with the invention.

Several example physical channel topologies in accordance with at least one embodiment of the invention are shown in FIG. 2.

Example configuration 201 illustrates in cross-section a quad-box stripline, with four signal conductors 202 embedded in dielectric medium 203 between ground planes 204. In some embodiments, vias 205 are incorporated to interconnect ground planes 204. In some embodiments, the locations of signal conductors 202 are modified by introducing periodic horizontal position offsets so as to provide more uniform characteristics for the four signal paths. As one example, the upper two signal conductors of 202 may be shifted left as the lower two signal conductors of 202 are simultaneously shifted right as illustrated in 210, and then the direction of these shifts reversed on each subsequent offset cycle, with the period and extent of the offsets chosen to provide more uniform characteristics for the four signal paths.

Example configuration 211 illustrates in cross-section a quadax cable, with four signal conductors 212 embedded in dielectric medium 213 surrounded or essentially surrounded by conductive shield 214. The external profile of the dielectric medium and conductive shield will in practice be a balance between manufacturing simplicity (e.g. a round profile as in conventional coax cable) and optimized transmission characteristics (e.g. the square or rectangular shape of 201) as is suggested by the profile provided for illustrative purposes at 214. As with the previous example, periodic perturbations of the inter-wire spacing of conductors 212 and/or their locations may be made to provide more uniform characteristics for the four signal paths.

Example configuration 221 shows a twisted quad cable, where individually insulated signal conductors 222 are twisted as a group around a common axis, either with or without a central insulating strand 223 to control overall diameter and spacing. Some embodiments may further optionally incorporate at least one of a central conductive neutral wire, surrounding insulation layer, and surrounding conductive shield layer to allow additional control over impedance characteristics and/or noise isolation.

It will be apparent to one familiar with the art that each example of FIG. 2 utilizes three-dimensional structuring of signal conductors to provide essentially equal impedance characteristics for each of the four signal wires, and also essentially equal inter-wire coupling characteristics among the four signal wires. These characteristics facilitate signal propagation modes providing effectively equal propagation velocity for signals on each wire, as well as effectively equal attenuation and frequency response characteristics. Comparable transmission characteristics may also be provided by other known cable designs, including braid twisted quad conductor cable, quad micro-coax cable, etc.

Other known cable designs including quad microstripline, dual pair microstripline, and dual twisted pair may also be usable with the described invention under some conditions. With such cables, not all signal propagation modes for the subsequently described H4 coded signals are identical, typically with one of the three major propagation modes experiencing reduced receive signal levels and slower propagation velocity. Some embodiments of the invention provide compensation for these effects through additional amplification of received signals of the degraded mode and delayed sampling of that mode's received signal values. Other embodiments provide a legacy communication capability, where signals are communicated using conventional dual differential transmission and reception, with reduced aggregate communications throughput.

Example signal levels, signal frequencies, and physical dimensions described herein are provided for purposes of explanation, and are not limiting. Other embodiments of the invention may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with the invention.

Encoding Information Using Hadamard Transforms

The Hadamard Transform, also known as the Walsh-Hadamard transform, is a square matrix of entries +1 and −1 so arranged that both all rows and all columns are mutually orthogonal. Hadamard matrices are known for all sizes 2N as well as for selected other sizes. In particular, the descriptions herein rely on 2×2 and 4×4 Hadamard matrices.

Figure 3A:
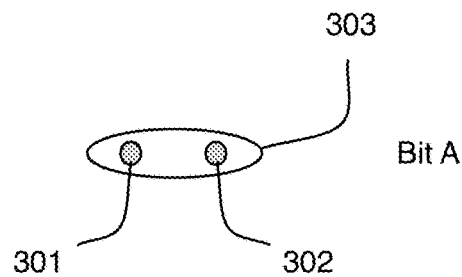
FIGS. 3A and 3B illustrate different transmission modes in differential and H4 encoded communications.

The order 2 Hadamard matrix is:

$$H_2 = \begin{bmatrix} 1 & 1 \\ 1 & -1 \end{bmatrix} \quad \text{(Eqn. 1)}$$

and conventional differential encoding of one bit A may be obtained by multiplying A by the Hadamard matrix H2 to obtain values for the resulting output signals W and X. It will be apparent to one familiar with the art that multiplication times the upper vector of the matrix corresponds to introduction of a positive or negative common-mode signal onto W and X, a transmission mode not generally used in practice on differential circuits, while multiplication times the lower vector of the matrix produces the familiar differential signals of $\{+1, -1\}$ for A positive, and $\{-1, +1\}$ for A negative. This is illustrated in FIG. 3A, where the two signal lines 301 and 302 representing the signals W and X carry the encoded transmission mode 303 representing the $\{+1, -1\}$ vector multiplied by the encoded bit A.

The order 4 Hadamard matrix is:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix} \quad \text{(Eqn. 2)}$$

and encoding of the three bits A, B, C may be obtained by multiplying those bits times the Hadamard matrix $H_4$ to obtain four output values. As in the previous example, the uppermost vector corresponds to common mode signaling, which is not used herein, with the next three vectors being used to encode bits A, B, and C respectively into outputs W, X, Y, Z. This is graphically illustrated in FIG. 3B, where the four signal line 311, 312, 313, and 314 represent the signals W, X, Y, Z respectively in each illustration, with the three illustrations representing the three distinct transmission modes representing the bit A multiplied by the vector $\{+1, -1, +1, -1\}$ at 320, the bit B multiplied by the vector $\{+1, +1, -1, -1\}$ at 330, and the bit C multiplied by the vector $\{+1, -1, -1, +1\}$ at 340.

Figure 3B:
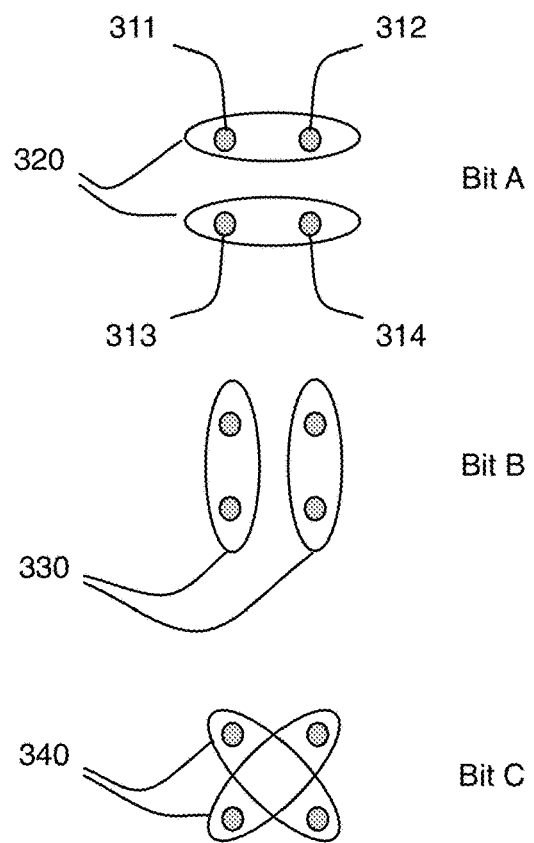

As in the example of FIG. 3A, the ovals in FIG. 3B identify signal pairs carrying opposing values. However, unlike in the previous example where only one transmission mode 303 was available for use, in the example of FIG. 3B each of the three illustrated modes 320, 330, and 340 may be used simultaneously to transmit A, B, and C. Thus, the observed signal levels on W, X, Y, Z used in such manner correspond to the sums of the three modes.

One familiar with the art will note that all possible values of A, B, C encoded in this manner result in mode summed values for W, X, Y, Z which are balanced; that is, summing to the constant value zero. If the mode summed values for W, X, Y, Z are scaled such that their maximum absolute value is 1 (that is, the signals are in the range +1 to −1 for convenience of description,) it will be noted that all achievable values are permutations of the values $\{+1, -\frac{1}{3}, -\frac{1}{3}, -\frac{1}{3}\}$ or of the values $\{-1, \frac{1}{3}, \frac{1}{3}, \frac{1}{3}\}$. These are called the code words of the vector signaling code H4.

H4 Code

Figure 8A:
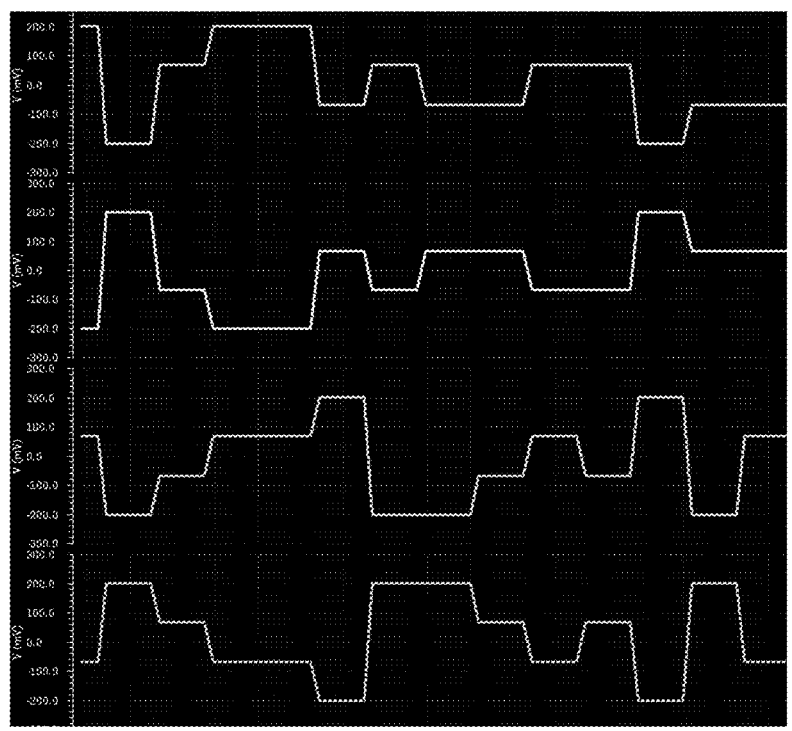
FIGS. 8A and 8B show individual wire signals of a transmitted H4 code and the combined signaling of all wires depicting the use of two of the four signal levels per transmit interval, in accordance with at least one embodiment of the invention.
Figure 8B:

As used herein, "H4" code, also called Ensemble NRZ code, refers to a vector signaling code and associated logic for such code wherein a transmitter consumes three bits and outputs signals on four wires in each symbol period. In some embodiments, parallel configurations comprising more than one group may be used, with each group comprising three bits transmitted on four wires per symbol period and an H4 encoder and an H4 decoder per group. With an H4 code, there are four signal wires and four possible coordinate values, represented herein as $+1, +\frac{1}{3}, -\frac{1}{3}$, and $-1$. The H4 code words are balanced, in that each code word is either one of the four permutations of $(+1, -\frac{1}{3}, -\frac{1}{3}, -\frac{1}{3})$ or one of the four permutations of $(-1, +\frac{1}{3}, +\frac{1}{3}, +\frac{1}{3})$, all such permutations summing to the equivalent of a zero value. H4 encoded signal waveforms are shown in FIG. 8A. It should be noted that although the constellation of all code words utilizes four distinct signal levels, only two signal levels will be utilized in any one code word, as is illustrated by a superposition of all four signal waveforms, as shown in FIG. 8B.

In a specific embodiment, a +1 might be sent as a signal using an offset of 200 mV, while a −1 is sent as a signal using an offset of −200 mV, a $+\frac{1}{3}$ is sent as a signal using an offset of 66 mV, and a $-\frac{1}{3}$ is sent as a signal using an offset of −66 mV, wherein the voltage levels are with respect to a fixed reference. Note that the average of all of the signals sent (or received, disregarding asymmetric effects of skew, crosstalk, and attenuation) in any single time interval regardless of the code word represented is "0", corresponding to the offset voltage. There are eight distinct code words in H4, which is sufficient to encode three binary bits per transmitted symbol interval.

Other variants of the H4 coding described above exist as well. The signal levels are given as examples, without limitation, and represent incremental signal values from a nominal reference level.

Encoder and Transmitter

Figure 1:
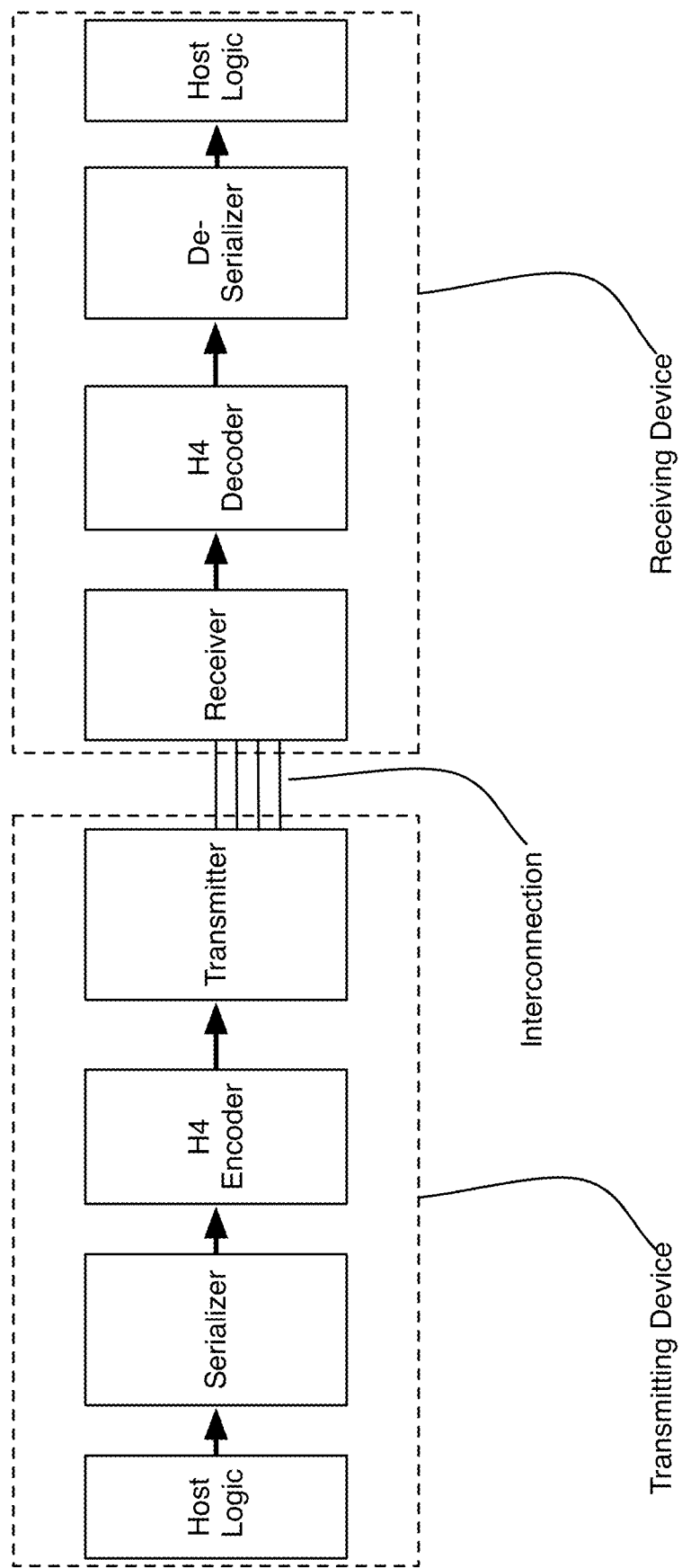
FIG. 1 is a block diagram of an example system comprising a transmitting device, interconnection, and receiving device, in accordance with at least one embodiment of the invention.
Figure 4:
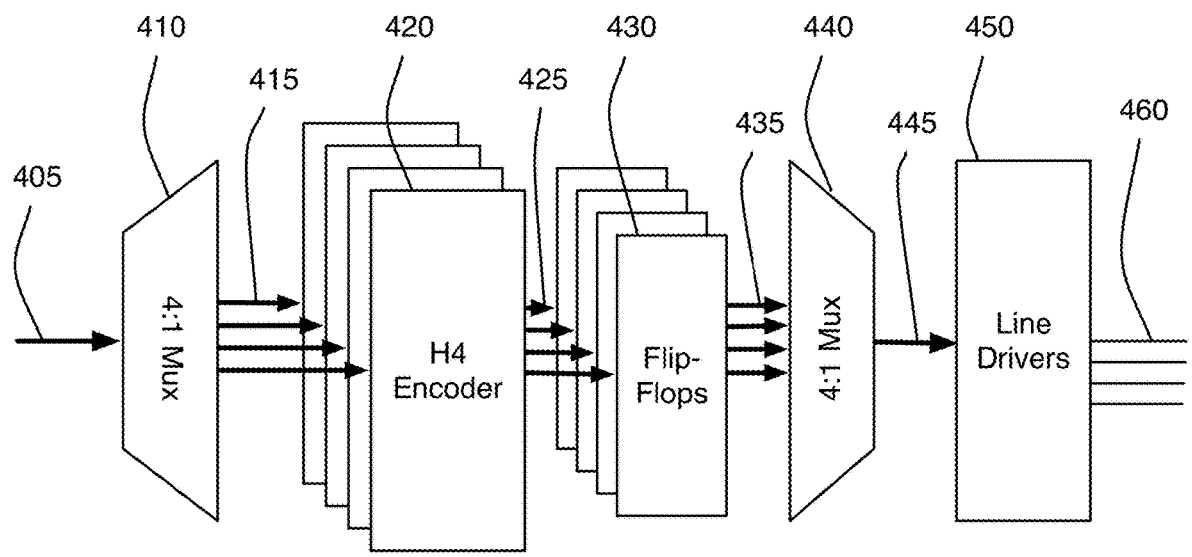
FIG. 4 is a block diagram of a H4 encoder and transmitter of the FIG. 1 system, in accordance with at least one embodiment of the invention.

FIG. 4 is a block diagram for one embodiment of the H4 encoder and transmitter components of the FIG. 1 system in accordance with the invention. This embodiment uses source- and destination-terminated current mode logic drivers with reduced signal swing.

High-speed communications embodiments often exceed the performance capabilities of a single communications circuit instance. As an example of how such a limitation is overcome, FIG. 4 shows as an example a 4:1 mux architecture that supports a line rate of as much as 4× the capabilities of a single circuit instance in the same process technology. Each of the processing stages 420 and 430 are embodied as four distinct instances, each instance processing source data into symbol data for one transmission interval. Any number of phases may be used, from a single phase performing all operations, to sixteen or more, with each of such multiple phases possibly also extending over a greater or lesser portion of the described transmission system than this example.

In one embodiment in accordance with the invention, source data, which may be subjected to scrambling, encryption, or encapsulation beyond the scope of this disclosure, is provided at 405. Multiplexer 410 sequentially distributes consecutive source data elements to the four encoding phases, and multiplexer 440 sequentially combines the resulting four encoded results into a single data stream for transmission. One embodiment accepts source data in twelve bit increments, which is then distributed as four three-bit portions to the four processing phases, and subsequently combined to produce the higher rate transmitted stream. Each H4 encoder 420 maps three bits of user data to one H4 code word, with the results buffered in flip-flops 430. At each symbol interval, one buffered H4 code word is selected, and then converted to the chosen wire signal levels by line drivers 450 for transmission on interconnection 460. This allows for transmission rates to be multiples of the processing rates of a single encoder or decoder.

The specific mapping function between three bits of source data and a specific H4 code word may be chosen for implementation convenience, as will be subsequently described.

Receiver and Decoder

The complementary receiver and decoder for the described H4 transmitter system perform a number of operations. The interconnection wires are terminated in a matched impedance, conventional amplification and filtration may be applied to compensate for channel attenuation, received signal levels corresponding to the symbol representations of the H4 code are measured, symbols interpreted as valid code words of the H4 code, and the detected code words mapped back to received data.

At least one embodiment in accordance with the invention combines at least some aspects of these receiver and decoder operations for efficiency. One embodiment in accordance with the invention shown in FIGS. 5A and 5B incorporate a differential comparator circuit operating on multiple inputs, summing the received signal values on two selected wires, summing the received signal values on the remaining two wires, and outputting a comparison of the two summed results. Such a multi-input comparator requires no fixed signal level reference and can provide a good level of common-mode noise rejection, in a circuit combining elements of line receiver and H4 code word detection operations. At least one embodiment in accordance with the invention further incorporates line equalization and amplification with the line receiver and code word detection operations.

Three instances of such multi-input comparator circuits operating on permutations of the same four input signals are sufficient to detect all code words of H4. That is, given a multi-input comparator that performs the operation $$R=(J+L)-(K+M) \tag{Eqn. 3}$$

where J, K, L, M are variables representing the four input signals values, then as one example and without limitation, the input permutations producing the three results $R_0$, $R_1$, $R_2$ based on the equations $$R_0 = (W+Y) - (X+Z) \quad \text{(Eqn. 4)}$$

$$R_1 = (Y+Z) - (W+X) \quad \text{(Eqn. 5)}$$

$$R_2 = (Y+X) - (Z+W) \quad \text{(Eqn. 6)}$$

are sufficient to unambiguously identify each code word of vector signaling code H4 as represented by receive signal input values W, X, Y, Z. The values $R_0$, $R_1$, $R_2$ may represent analog signal results if both the addition and difference functions are performed linearly, or may represent binary outputs if the difference function is performed by a digital comparator, equivalent to performing a sign( ) function on analog outputs. Because of the nature of the encoded H4 code words, none of the analog results $R_0$, $R_1$, $R_2$ will be at zero, implying that none of the corresponding digital comparator results will be ambiguous.

For some encoder mappings of source data to transmitted H4 code words, a direct relationship between the detected result of these three receive comparators and the receive data exists, eliminating the need for additional decode mapping logic at the receiver. Thus, a preferred embodiment will first select the desired permutations of input signals to be processed by each of the three multi-input receive comparators, will then document the three comparator output values obtained for each valid code word, and will then define a transmit mapping function that performs the corresponding mapping of three transmit data bits to the four transmit signal values of the corresponding code word. One example of such a mapping is shown in FIG. 6.

Figure 5A:
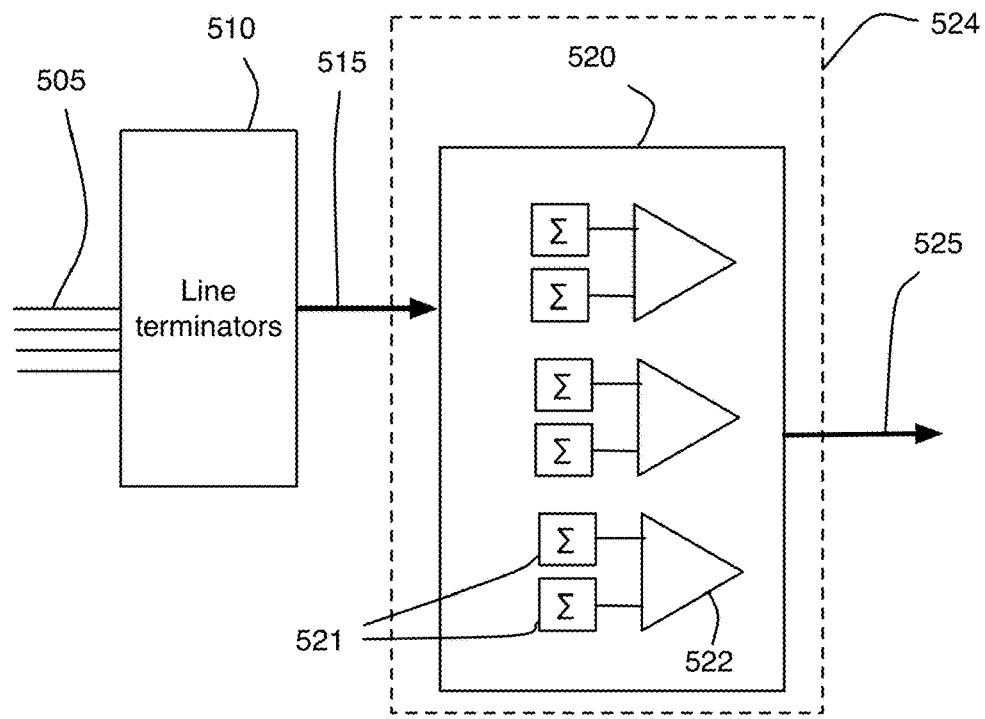
FIGS. 5A and 5B show block diagrams for the receiver and H4 decoder components of the FIG. 1 system utilizing a single process phase and multiple processing phases, in accordance with at least one embodiment of the invention.

FIG. 5A shows a block diagram of such a receiver for a group of four wires using the H4 code. Each receive interconnection line 505 is terminated at 510. In some embodiments, line termination may further incorporate overvoltage protection, DC blocking capacitors, and introduction of a common mode or bias voltage for subsequent processing stages. Terminated receive signals 515 are presented to multi-input comparators 520, which perform the H4 detection by performing summation 521 and difference or comparison 522 operations. In this example, a direct mapping of comparator outputs to received data 525 is shown.

Figure 5B:
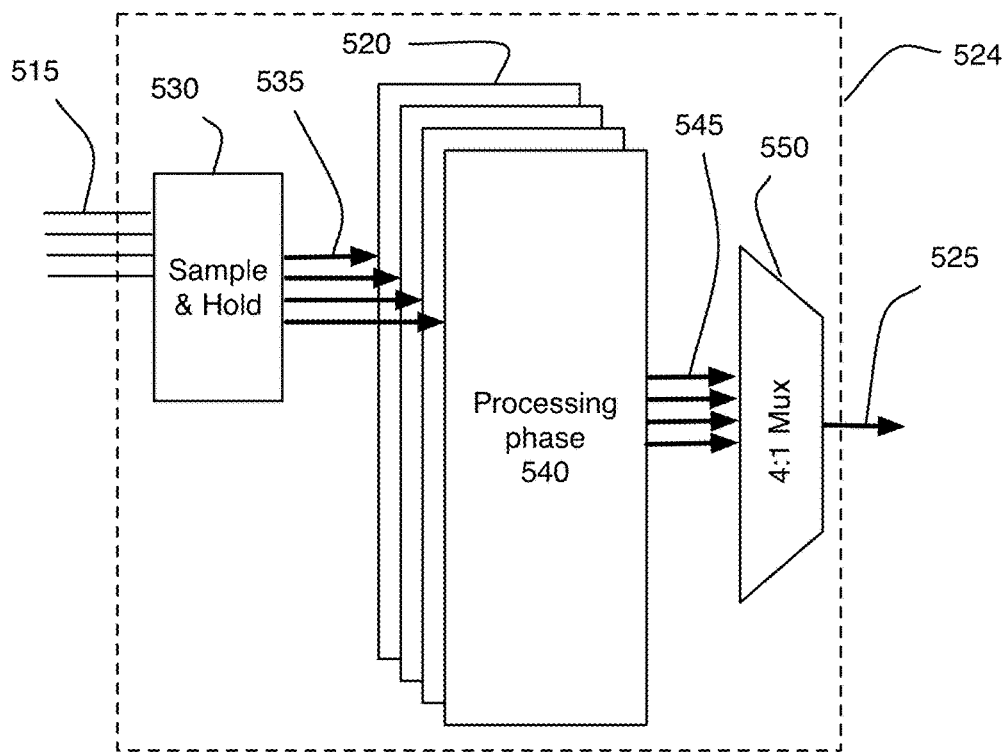

As with the described transmitter example, multiple processing phases may be used to allow symbol signaling rates greater than might be supported by a single circuit instance in the available semiconductor technology. FIG. 5B illustrates multi-phase receive processing, with an example four phase embodiment of receive comparator subsystem 524. To show the transparent nature of the multi-phase processing technique, the example portion 524 of FIG. 5A may be replaced by the four phase embodiment of FIG. 5B, retaining common inputs 515 and outputs 525.

As shown in FIG. 5B, terminated receive signals 515 are captured by sample-and-hold 530, providing stable signal levels 535 as inputs to each of the example four processing phases 540. To provide the maximum processing time to each processing phase 540 (which in this example is comprised of the receive comparator component 520 of FIG. 5A), one sample-and-hold per input signal is provided per phase (thus, in this example, sixteen total) with each operating at one quarter the receive symbol rate. Detected results 545 from all phases are combined by multiplexer 550 into a combined received data stream equivalent to that of FIG. 5A. Other embodiments may incorporate different numbers of phases and/or different numbers of sample-and-hold elements providing different timing constraints, and may incorporate greater or lesser amounts of the receive system into the multiple processing phases.

H4 Code with Digital Feedback Equalization

Modern high-speed serial receiver designs are strongly reliant on Decision Feedback Equalization (DFE) methods, which are well known solutions for compensation of transmission medium perturbations including signal reflections and crosstalk. It had been observed that such perturbations are driven by delayed components of previously transmitted data (e.g. as delayed reflections from impedance discontinuities in the communications path) which interfere with subsequently transmitted data. Thus, detected data may be stored by a DFE system at the receiver, and suitably delayed and attenuated components subtracted from the current input signal so as to nullify those effects.

This simple feedback loop DFE is constrained by the need to fully detect the value of the currently received data bit in time to feed it back as compensation for signals in the next signal interval. As transmission rates increase, this window of time becomes smaller. Furthermore, distributing receive processing across multiple processing phases increases throughput, at the cost of latency. Thus, information about a given receive interval's data may not be available for many receive cycles. Solutions using "unrolled" DFE correction are known, allowing inline compensation to be performed for the critical initial receive intervals of the DFE process.

Classic binary DFE solutions may be combined with the described H4 receiver designs at the point where individual modulation modes (representing individual data bits) are detected, if the signal reflections requiring compensation are similar for the four signal paths. Each mode is communicated as signals over all four signal paths, but the combinations of such signals is by definition orthogonal for each mode, thus signal perturbations on distinct paths is possible through judicious combination of modal compensations. It should be noted that signals encoded on the wire may take on any of four values (albeit two at any one time) while signals representing each transmission mode are always two-valued. Thus, storage and delay components of a DFE are at least twice as complex if performed on wire signals versus modulation mode signals.

Figure 7A:
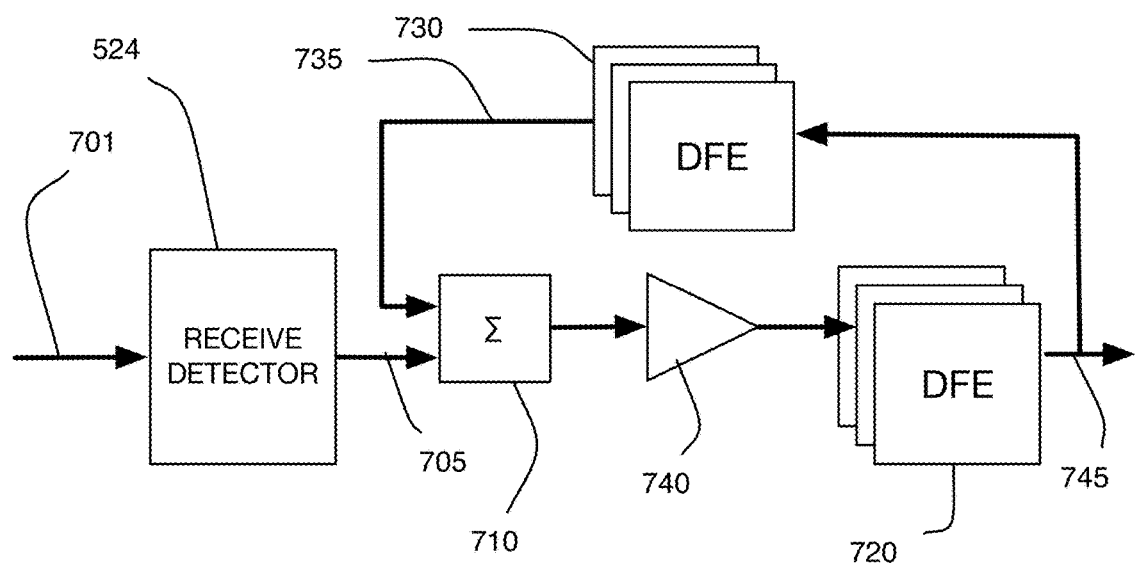
FIGS. 7A and 7B show block diagrams of receivers incorporating two approaches to DFE compensation, in accordance with at least one embodiment of the invention.

One embodiment in accordance with the invention is shown in the block diagram of FIG. 7A. The four receive signal inputs 701 are input to receive detector 524 (previously described in FIGS. 5A and 5B), which in this example is configured to produce three analog outputs 705 corresponding to the transmission modes used to communicate each data bit. On each such analog output, a DFE correction signal 735 from one of three binary DFE circuits 730 is summed 710 to nullify the signal distortions on that analog signal, and the signals optionally converted to digital value by comparators 740.

As is well known to those familiar with the art, the required high gain of a digital comparator is often obtained using a series of stages of moderate gain. External signals may be injected at an interconnecting circuit node between two such stages; in one common example, an adjustable DC level is introduced at such a node to correct the comparator's input balance or offset. In another embodiment, elements 710 and 740 may thus represent stages within a multi-input comparator as in 520 of FIG. 5A. One familiar with the art will observe that a DFE correction signal may also be introduced at other circuit nodes, as one example at a comparator input, providing equivalent functionality.

As is common practice, the Decision Feedback Equalization corresponding to at least the first several bit times preceding the current receive interval are "unrolled" or performed inline along with the data path processing for higher performance, rather than by a closed loop feedback method, by the three unrolled binary DFE circuits 720, with DFE corresponding to the remaining bit times being compensated being performed by conventional feedback loop DFE at 730.

In the embodiment shown, feedback DFE circuits 730 accept digital bit inputs and output appropriately scaled and delayed analog signals, while unrolled DFE circuits 720 accepts digital inputs and produces digital bit outputs. Other embodiments in accordance with the invention may utilize different combinations of input signals and output results in the DFE components. In one embodiment, the three DFE circuits 730 operate on analog values 725, rather than from the equivalent binary values 745 obtained from comparators 740.

Figure 7B:
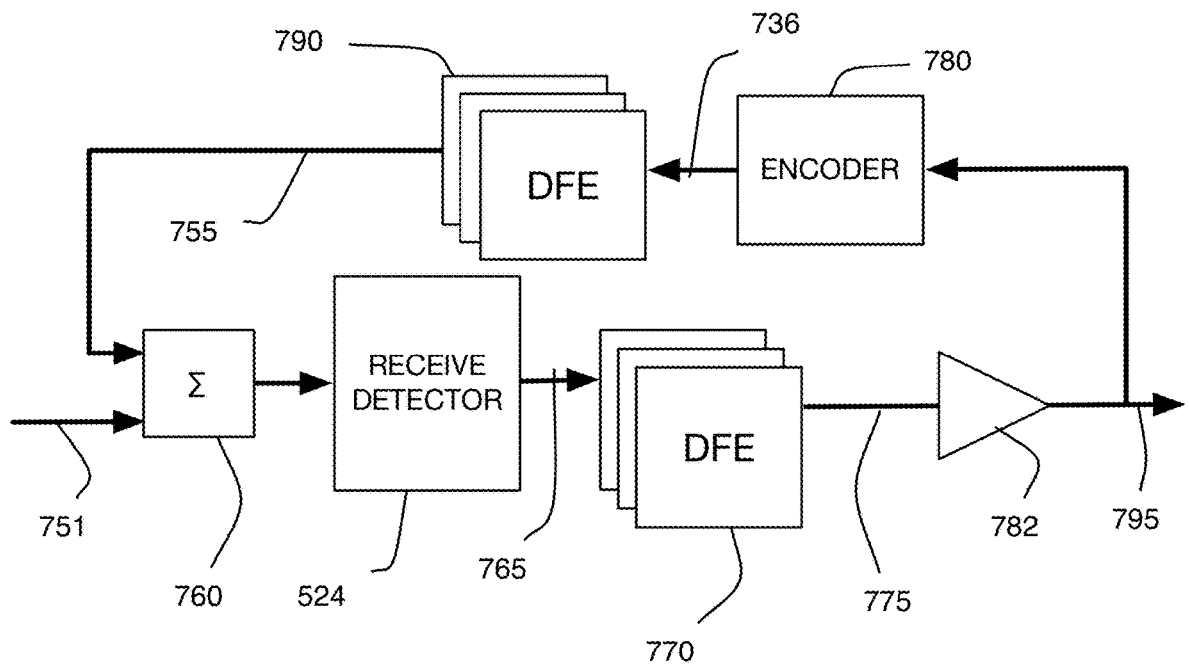

An alternative and more complex DFE embodiment of the invention is also known, which may be applied if the reflections are markedly different amongst the four wires. In this approach shown in FIG. 7B, DFE is performed by adding 760 four DFE correction signals 755, one for each analog wire signal 751 rather than for each transmission mode, allowing independent equalization for each physical wire path at the cost of significantly greater complexity and power consumption. The compensated wire signals are processed by receive detector 524 to produce outputs 765. In such an embodiment, at least the first several bits may be equalized by an unrolled binary DFE 770 operating on the three individual modulation modes as before. For corrections beyond that amount, an enhanced architecture DFE is used. The three data outputs 795 are re-encoded 790 into the corresponding four level symbol representation 736 used on the line, and four four-level DFE circuits 790 perform the remainder of the equalization, each operating on one wire-level signal to produce compensation signals 755. In some embodiments, the function of digital comparators 782 are performed within DFE 770, so that outputs 775 are equivalent to outputs 795. Similarly, in at least one embodiment unrolled DFE 770 operates on digital output signals from receive detector 524 representing binary data bits.

The number of bits of DFE compensation utilized in either described embodiment of the invention, both as inline "unrolled" DFE and as conventional feedback DFE, may be chosen based on the needs of the specific communications system, without limitation. At least one embodiment in accordance with the invention includes at least some DFE operations within the multiphase processing portion of the receiver.

Receive Method Description

Figure 9:
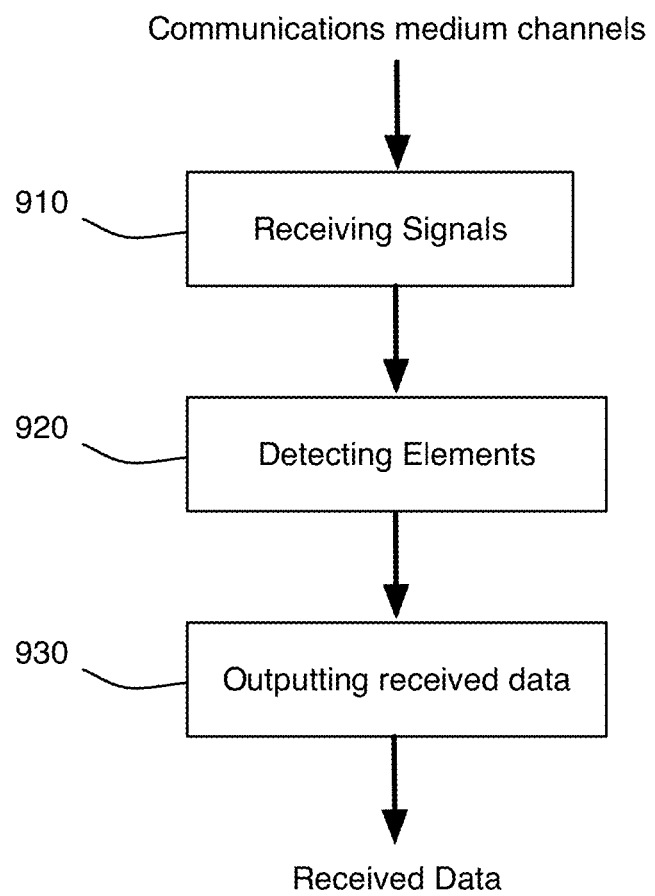
FIG. 9 is a block diagram illustrating a method, in accordance with some embodiments.

To summarize and clarify the previous descriptions of receiver operations and their interactions with receive mode DFE and/or receive signal DFE, the following descriptions are made using the diagram of FIG. 9.

In element 910, signals from the separate channels of the communications medium are received, obtaining channel signal values representing the signal of each channel.

In some embodiments, additional processing including amplification, filtering, and frequency-dependent amplification may be performed on the signals of each channel as part of obtaining channel signal values, as is common practice. In some embodiments, correction signals derived from past channel activity are incorporated in this additional processing, as one example to neutralize past signal reflections and other spurious communications channel effects. Such correction based on past activity is known as Decision Feedback Equalization, herein being applied to channel signals.

In element 920, elements of the vector signaling code are detected by a method comprising obtaining a first sum of two selected channel signal values, obtaining a second sum of the remaining two channel signal values, and comparison of the first sum and the second sum to obtain the detected element. Multiple elements are detected by choosing different selected channel signal values for each element; for the example H4 vector signaling code, three such elements may be detected by three different permutations of channel signal values used to produce a first sum and a second sum.

In some embodiments, correction signals derived from previously detected elements of the vector signaling code are incorporated into detection of current elements of the vector signaling code, as one example in an alternative method of neutralizing past signal reflections and other spurious communications channel effects. As examples, a correction signal representing a compensation for past signal reflections and other spurious communication channel effects impacting one or more particular modulation modes may be introduced into element detection, so as to modify inputs to the comparison, or to bias the comparison operation itself. Such correction based on past activity is known as Decision Feedback Equalization, herein being applied to modulation modes of the communications channel.

In element 920, elements of the vector signaling code are detected by a method comprising obtaining a first sum of two selected channel signal values, obtaining a second sum of the remaining two channel signal values, and comparison of the first sum and the second sum to obtain the detected element. Multiple elements are detected by choosing different selected channel signal values for each element; for the example H4 vector signaling code, three such elements may be detected by three different permutations of channel signal values used to produce a first sum and a second sum.

In element 930, received data derived from the detected elements of the vector signaling code are output. As previously described, in preferred embodiments the transmit encoding is chosen such that the detected elements of the vector signaling code directly correspond to bits of the received data.

The described method thus measures and acts upon physical signal inputs, and produces a physical result of received data, which may be acted upon by subsequent components of a larger system or process.

The examples presented herein illustrate the use of vector signaling codes for point-to-point chip-to-chip interconnection. However, this should not been seen in any way as limiting the scope of the described invention. The methods disclosed in this application are equally applicable to other interconnection topologies and other communication media including optical, capacitive, inductive, and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. An apparatus comprising:
a pair of ground planes arranged in parallel;
a dielectric medium disposed in between the pair of ground planes; and
a set of at least four signal conductors disposed in the dielectric medium, the set of at least four signal conductors comprising (i) a first pair of signal conductors arranged proximate to a first ground plane of the pair of ground planes and (ii) a second pair of signal conductors arranged proximate to a second ground plane of the pair of ground planes, each signal conductor of the set of at least four signal conductors configured to carry a respective signal corresponding to a symbol of a codeword of a vector signaling code, wherein the first pair of signal conductors has a horizontal offset along a length of the dielectric medium with respect to the second pair of signal conductors.

2. The apparatus of claim 1, further comprising conductive vias connecting the pair of ground planes.

3. The apparatus of claim 1, wherein signal conductors in the first and second pairs of signal conductors are equidistant from each other.

4. The apparatus of claim 1, wherein the vector signaling code comprises all permutations of $\{+1, -\frac{1}{3}, -\frac{1}{3}, -\frac{1}{3}\}$ and $\{-1, \frac{1}{3}, \frac{1}{3}, \frac{1}{3}\}$.

5. The apparatus of claim 1, wherein a sum of the respective signals carried on the at least four signal conductors corresponds to a constant value.

6. The apparatus of claim 1, wherein the codeword of the vector signaling code comprises a superposition of three propagation modes.

7. The apparatus of claim 6, wherein one of the three propagation modes has a lower propagation velocity relative to the other two propagation modes.

8. The apparatus of claim 7, further comprising delaying sampling timings of the other two propagation modes.

9. The apparatus of claim 6, wherein one of the three propagation modes has reduced receive signal levels relative to the other two propagation modes.

10. The apparatus of claim 6, further comprising amplifying the one propagation mode relative to the other two propagation modes.

11. A method comprising:
receiving a set of information bits;
generating symbols of a codeword of a vector signaling code; and
transmitting the symbols of the codeword in parallel over respective signal conductors of a set of at least four signal conductors disposed in a dielectric medium, the set of at least four signal conductors comprising (i) a first pair of signal conductors arranged proximate to a first ground plane of a pair of ground planes and (ii) a second pair of signal conductors arranged proximate to a second ground plane of the pair of ground planes, wherein the first pair of signal conductors has a horizontal offset along a length of the dielectric medium with respect to the second pair of signal conductors.

12. The method of claim 11, wherein the codewords of the vector signaling code comprise all permutations of $\{+1, -\frac{1}{3}, -\frac{1}{3}, -\frac{1}{3}\}$ and $\{-1, \frac{1}{3}, \frac{1}{3}, \frac{1}{3}\}$.

13. The method of claim 11, wherein a sum of the respective signals carried on the at least four signal conductors corresponds to a constant value.

14. The method of claim 11, wherein the codeword of the vector signaling code comprises a superposition of three propagation modes, each propagation mode transmitting a respective information bit.

15. The method of claim 14, wherein one of the three propagation modes has a lower propagation velocity relative to the other two propagation modes.

16. The method of claim 15, further comprising delaying sampling timings of the other two propagation modes.

17. The method of claim 14, wherein one of the three propagation modes has reduced receive signal levels relative to the other two propagation modes.

18. The method of claim 17, further comprising amplifying the one propagation mode relative to the other two propagation modes in the superposition of the three propagation modes.

19. An apparatus comprising:
a pair of ground planes arranged in parallel;
a dielectric medium disposed in between the pair of ground planes; and
a set of at least four signal conductors disposed in the dielectric medium, the set of at least four signal conductors comprising (i) a first pair of signal conductors arranged proximate to a first ground plane of the pair of ground planes and (ii) a second pair of signal conductors arranged proximate to a second ground plane of the pair of ground planes, each signal conductor of the set of at least four signal conductors configured to carry a respective signal corresponding to a symbol of a codeword of a vector signaling code, wherein the vector signaling code comprises all permutations of $\{+1, -\frac{1}{3}, -\frac{1}{3}, -\frac{1}{3}\}$ and $\{-1, \frac{1}{3}, \frac{1}{3}, \frac{1}{3}\}$.

20. The apparatus of claim 19, further comprising conductive vias connecting the pair of ground planes.

21. The apparatus of claim 19, wherein signal conductors in the first and second pairs of signal conductors are equidistant from each other.

22. The apparatus of claim 19, wherein a sum of the respective signals carried on the at least four signal conductors corresponds to a constant value.

23. The apparatus of claim 19, wherein the codeword of the vector signaling code comprises a superposition of three propagation modes.

24. The apparatus of claim 23, wherein one of the three propagation modes has a lower propagation velocity relative to the other two propagation modes.

25. The apparatus of claim 24, further comprising delaying sampling timings of the other two propagation modes.

26. The apparatus of claim 23, wherein one of the three propagation modes has reduced receive signal levels relative to the other two propagation modes.

27. The apparatus of claim 23, further comprising amplifying the one propagation mode relative to the other two propagation modes.

28. An apparatus comprising:
a pair of ground planes arranged in parallel;
a dielectric medium disposed in between the pair of ground planes; and
a set of at least four signal conductors disposed in the dielectric medium, the set of at least four signal conductors comprising (i) a first pair of signal conductors arranged proximate to a first ground plane of the pair of ground planes and (ii) a second pair of signal conductors arranged proximate to a second ground plane of the pair of ground planes, each signal conductor of the set of at least four signal conductors configured to carry a respective signal corresponding to a symbol of a codeword of a vector signaling code, wherein the codeword of the vector signaling code comprises a superposition of three propagation modes.

29. The apparatus of claim 28, further comprising conductive vias connecting the pair of ground planes.

30. The apparatus of claim 28, wherein signal conductors in the first and second pairs of signal conductors are equidistant from each other.

31. The apparatus of claim 28, wherein a sum of the respective signals carried on the at least four signal conductors corresponds to a constant value.

32. The apparatus of claim 28, wherein one of the three propagation modes has a lower propagation velocity relative to the other two propagation modes.

33. The apparatus of claim 32, further comprising delaying sampling timings of the other two propagation modes.

34. The apparatus of claim 28, wherein one of the three propagation modes has reduced receive signal levels relative to the other two propagation modes.

35. The apparatus of claim 34, further comprising amplifying the one propagation mode relative to the other two propagation modes.

36. A method comprising:
   receiving a set of information bits;
   generating symbols of a codeword of a vector signaling code; and
   transmitting the symbols of the codeword in parallel over respective signal conductors of a set of at least four signal conductors disposed in a dielectric medium, the set of at least four signal conductors comprising (i) a first pair of signal conductors arranged proximate to a first ground plane of a pair of ground planes and (ii) a second pair of signal conductors arranged proximate to a second ground plane of the pair of ground planes, wherein the codewords of the vector signaling code comprise all permutations of $\{+1, -\frac{1}{3}, -\frac{1}{3}, -\frac{1}{3}\}$ and $\{-1, \frac{1}{3}, \frac{1}{3}, \frac{1}{3}\}$.

37. The method of claim 36, wherein a sum of the respective signals carried on the at least four signal conductors corresponds to a constant value.

38. The method of claim 36, wherein the codeword of the vector signaling code comprises a superposition of three propagation modes, each propagation mode transmitting a respective information bit.

39. The method of claim 38, wherein one of the three propagation modes has a lower propagation velocity relative to the other two propagation modes.

40. The method of claim 39, further comprising delaying sampling timings of the other two propagation modes.

41. The method of claim 38, wherein one of the three propagation modes has reduced receive signal levels relative to the other two propagation modes.

42. The method of claim 41, further comprising amplifying the one propagation mode relative to the other two propagation modes in the superposition of the three propagation modes.

43. A method comprising:
   receiving a set of information bits;
   generating symbols of a codeword of a vector signaling code; and
   transmitting the symbols of the codeword in parallel over respective signal conductors of a set of at least four signal conductors disposed in a dielectric medium, the set of at least four signal conductors comprising (i) a first pair of signal conductors arranged proximate to a first ground plane of a pair of ground planes and (ii) a second pair of signal conductors arranged proximate to a second ground plane of the pair of ground planes, wherein the codeword of the vector signaling code comprises a superposition of three propagation modes, each propagation mode transmitting a respective information bit.

44. The method of claim 43, wherein a sum of the respective signals carried on the at least four signal conductors corresponds to a constant value.

45. The method of claim 43, wherein one of the three propagation modes has a lower propagation velocity relative to the other two propagation modes.

46. The method of claim 45, further comprising delaying sampling timings of the other two propagation modes.

47. The method of claim 43, wherein one of the three propagation modes has reduced receive signal levels relative to the other two propagation modes.

48. The method of claim 47, further comprising amplifying the one propagation mode relative to the other two propagation modes in the superposition of the three propagation modes.

* * * * *